US007943430B2

United States Patent
Chen

(10) Patent No.: US 7,943,430 B2
(45) Date of Patent: May 17, 2011

(54) SEMICONDUCTOR DEVICE WITH HEAT SINK AND METHOD FOR MANUFACTURING THE SAME

(75) Inventor: Kuan-Chun Chen, Taichung Hsien (TW)

(73) Assignee: Kuan-Chun Chen, Taichung Hsien (TW)

( * ) Notice: Subject to any disclaimer, the term of this patent is extended or adjusted under 35 U.S.C. 154(b) by 525 days.

(21) Appl. No.: 12/170,482

(22) Filed: Jul. 10, 2008

(65) Prior Publication Data

US 2009/0026606 A1 Jan. 29, 2009

(30) Foreign Application Priority Data

Jul. 20, 2007 (TW) ................................ 96126709 A

(51) Int. Cl.
*H01L 23/36* (2006.01)
*H01L 23/367* (2006.01)
(52) U.S. Cl. ........ 438/122; 257/707; 257/712; 257/717; 257/E23.101; 257/E21.504; 438/618
(58) Field of Classification Search .................. 257/707, 257/712, 717, E23.101, E21.504; 438/122, 438/618
See application file for complete search history.

(56) References Cited

U.S. PATENT DOCUMENTS

| 4,069,498 | A | * | 1/1978 | Joshi | 257/713 |
| 4,103,321 | A | * | 7/1978 | Gansert et al. | 361/711 |
| 5,105,259 | A | * | 4/1992 | McShane et al. | 257/667 |
| 5,796,582 | A | * | 8/1998 | Katchmar | 361/704 |
| 6,430,047 | B2 | * | 8/2002 | Wentzel et al. | 361/704 |
| 6,670,751 | B2 | * | 12/2003 | Song et al. | 313/512 |

* cited by examiner

*Primary Examiner* — Thao X Le
*Assistant Examiner* — Tanika Warrior
(74) *Attorney, Agent, or Firm* — Thomas, Kayden, Horstemeyer & Risley, LLP

(57) ABSTRACT

A semiconductor device and a method for manufacturing the same are described. The semiconductor device comprises: a heat sink having at least one opening passing through the heat sink; at least one semiconductor chip disposed in the opening, wherein the semiconductor chip includes a first side and a second side on opposite sides; an electricity conducting thin film filling in a first depth portion of the opening, wherein the second side of the semiconductor chip is embedded in the electricity conducting thin film; a heat conducting thick film filling in a second depth portion of the opening, wherein the electricity conducting thin film is directly connected with the heat conducting thick film; at least one wire electrically connecting the semiconductor chip and an external circuit; and an encapsulant covering a portion of the heat sink, the semiconductor chip, the wire and an exposed portion of the electricity conducting thin film.

16 Claims, 17 Drawing Sheets

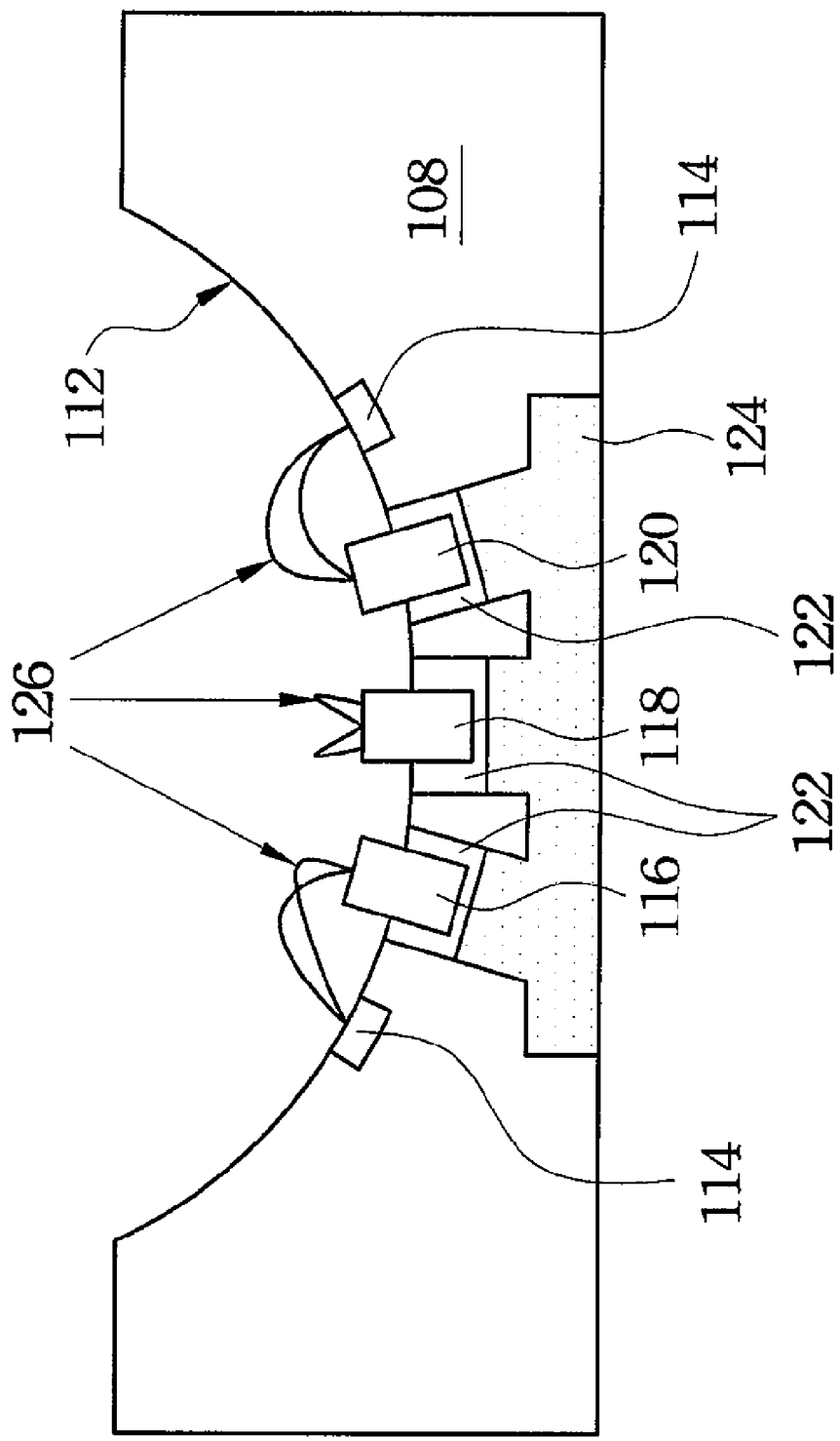

US 7,943,430 B2

SEMICONDUCTOR DEVICE WITH HEAT SINK AND METHOD FOR MANUFACTURING THE SAME

RELATED APPLICATIONS

This application claims priority to Taiwan Application Serial Number 96126709, filed Jul. 20, 2007, which is herein incorporated by reference.

FIELD OF THE INVENTION

The present invention relates to a semiconductor device and a method for manufacturing the same, and more particularly, to a semiconductor device with a heat sink and a method for manufacturing the same.

BACKGROUND OF THE INVENTION

Currently, packaging techniques for semiconductor devices, such as transistors, integrated circuits, or opto-electrical devices including light-emitting diodes (LEDs) and laser diodes (LDs), include using glue or silver solder paste to connect semiconductor chips and frames or sub-mounts while flip-chip techniques are performed by using metal bumps to connect semiconductor chips and package substrates or frames. The glue or silver solder paste is usually mixed with polymer materials to provide viscosity.

The glue or solder paste is usually mixed with polymer materials, so that the thermal conductivity of the glue or silver solder paste is much lower than those of metals, and the heat-dissipating efficiency of semiconductor devices is obviously poor. In the flip-chip techniques, alloys, such as AuSn, are used as the materials of the metal bumps, however, the thermal conductivity of the alloys still cannot fulfill the high heat-dissipating requirements of the semiconductor devices.

In addition, in the process of fixing the semiconductor chips with glue and solder paste or in the flip-chip package processes, the process temperature has to be increased to above 150° C., even above 200° C. in the flip-chip package processes. During the thermal connection processes at this temperature, the semiconductor device properties are easily damaged, thereby degrading the operation stability and quality of the semiconductor devices. Furthermore, the connection of fixing the chips takes at least three hours from coating the glue, disposing chips, to baking the glue.

According to the aforementioned description, after the semiconductor chip and the package substrate are connected by the conventional techniques, the heat-dissipating ability of the whole semiconductor device is poor. Many issues are caused by the poor heat-dissipating property of the whole semiconductor device. For example, the semiconductor device cannot be operated with high power, and the inherent properties of the semiconductor device cannot be elaborated completely. In addition, the operation speed of the semiconductor device has to be lowered to prevent the device from generating a large amount of heat and the heat cannot be dissipated timely from being occurred, so as to prevent the semiconductor device from being thermally damaged as a result of the excessively high temperature. Moreover, in order to lower the temperature of the semiconductor device, a module composed of semiconductor devices is typically set with a heat-dissipating device, such as a fan and a heat pipe, so that the volume of the semiconductor apparatus and the design complexity of the apparatus are greatly increased to further increase the cost of the product.

SUMMARY OF THE INVENTION

Therefore, one aspect of the present invention is to provide a semiconductor device, in which a semiconductor chip can be closely connected to a heat sink by a high electricity conducting thin film and a high heat conducting thick film directly without using glue materials. As a result, the heat-dissipating ability of semiconductor device can be greatly enhanced, and a high temperature process for fixing the semiconductor chip is eliminated to prevent the optical and electrical properties of the semiconductor device from being damaged.

Another aspect of the present invention is to provide a semiconductor device, which has superior heat-dissipating ability, so that the semiconductor device can be operated with high power to effectively bring out its original functions. In addition, a large amount of heat generated by the semiconductor device with superior heat-dissipating ability operating at a high operation speed can be rapidly conducted and dissipated, so that it can prevent the semiconductor device from being burned out by a high temperature, thereby greatly prolonging the operation life of the device.

Still another aspect of the present invention is to provide a semiconductor device with a high heat-conducting ability, so that a heat-dissipating device, such as a fan or a heat pipe, is unnecessary. As a result, the volume of the semiconductor device can be reduced, the device complexity of the semiconductor device can be lowered, and the cost of the device can be greatly decreased.

Yet another aspect of the present invention is to provide a method for manufacturing a semiconductor device, which can effectively decrease the process time to achieve a benefit of mass production.

Further another aspect of the present invention is to provide a method for manufacturing a semiconductor device, which can fix semiconductor chips onto heat sinks with various shapes and sizes according to needs of various products.

According to the aforementioned aspects, the present invention provides a semiconductor device, comprising: a heat sink having at least one opening passing through the heat sink; at least one semiconductor chip correspondingly disposed in the opening of the heat sink, wherein the semiconductor chip includes a first side and a second side on opposite sides; an electricity conducting thin film filling in a first depth portion of the opening of the heat sink, wherein the second side of the semiconductor chip is embedded in the electricity conducting thin film; a heat conducting thick film filling in a second depth portion of the opening of the heat sink, wherein the electricity conducting thin film is directly connected with the heat conducting thick film; at least one wire electrically connecting the semiconductor chip and an external circuit; and an encapsulant covering a portion of the heat sink, the semiconductor chip, the wire and an exposed portion of the electricity conducting thin film.

According to a preferred embodiment of the present invention, the thickness of the electricity conducting thin film is less than 10 μm.

According to another preferred embodiment of the present invention, the thickness of the heat conducting thick film is greater than 100 μm.

According to the aforementioned aspects, the present invention provides a method for manufacturing a semiconductor device, comprising: providing a mold; forming a glue layer on a predetermined area of a surface of the mold; disposing a heat sink on the surface of the heat sink, wherein the heat sink has at least one opening passing through the heat sink, and the opening corresponds to the predetermined area of the surface of the mold and exposes a portion of the glue layer; providing at least one semiconductor chip correspondingly disposed in the opening of the heat sink, wherein the semiconductor chip includes a first side and a second side on opposite sides, and the first side of the semiconductor chip is pressed in the glue layer exposed by the opening; forming an electricity conducting thin film to fill in a first depth portion of the opening and to cover the second side of the semiconductor chip; forming a heat conducting thick film to fill in a second depth portion of the opening and to directly cover the electricity conducting thin film; removing the glue layer and the mold to expose the first side of the semiconductor chip, a portion of the electricity conducting thin film and the heat sink; forming at least one wire to electrically connect the semiconductor chip and an external circuit; and forming an encapsulant to encapsulate a portion of the heat sink, the semiconductor chip, the wire and an exposed portion of the electricity conducting thin film.

According to a preferred embodiment of the present invention, the step of forming the electricity conducting thin film is performed by an evaporation method, a sputtering method, an electroless plating method or an electro plating method.

According to another preferred embodiment of the present invention, the step of forming the heat conducting thick film is performed by an electroless plating method or an electro plating method.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1A:
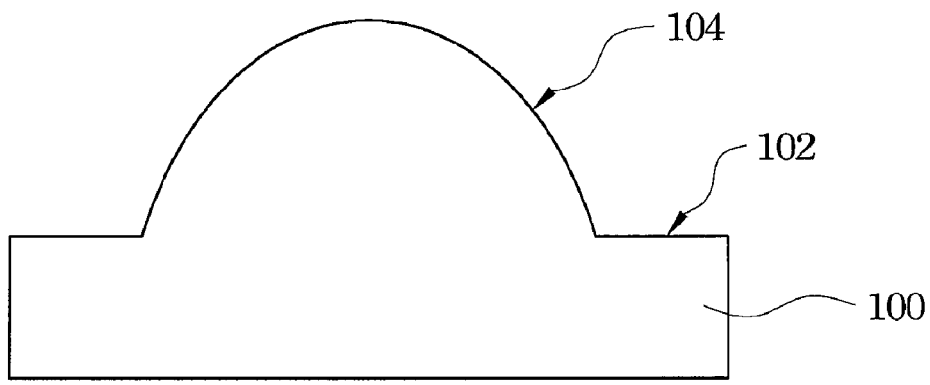
FIG. 1A through to FIG. 10B are schematic flow diagrams showing the process for manufacturing a semiconductor device in accordance with a preferred embodiment of the present invention, wherein the schematic flow diagrams includes cross-sectional views and the corresponding top views.
Figure 1B:
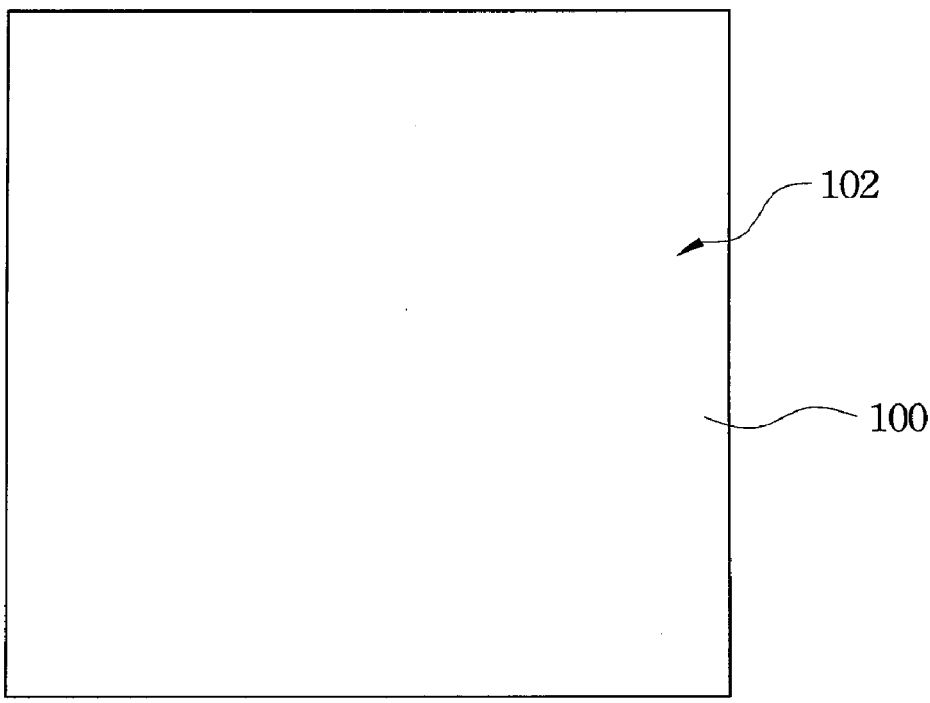

The present invention discloses a semiconductor device and a method for manufacturing the same. In order to make the illustration of the present invention more explicit, the following description is stated with reference to FIG. 1A through to FIG. 10B.

FIG. 1 through FIG. 10B are schematic flow diagrams showing the process for manufacturing a semiconductor device in accordance with a preferred embodiment of the present invention, wherein the schematic flow diagrams includes cross-sectional views and the corresponding top views. In an exemplary embodiment, when a semiconductor device is manufactured, a mold 100 is provided, such as shown in shown in FIG. 1A and FIG. 1B, wherein FIG. 1A is the cross-sectional view and FIG. 1B is the corresponding top view. In the present invention, the mold may include a flat surface, so the mold may be a flat substrate; or the shape of the mold may be designed according to the needs of a product to make the surface of the mold include a three-dimensional structure. In the present exemplary embodiment, a surface 102 of the mold 100 is set with a three-dimensional structure 104 according to the need of the product, such as shown in FIG. 1A.

Figure 2A:
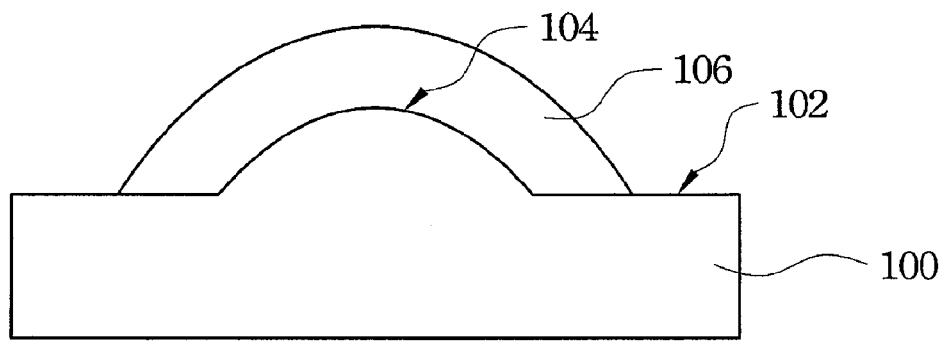
Figure 2B:
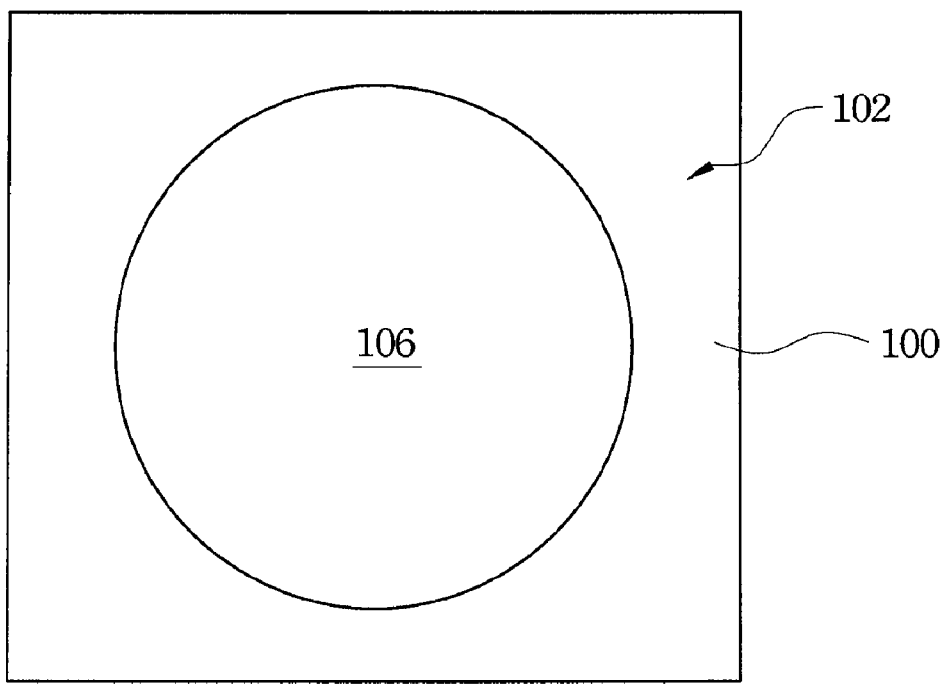

Next, a glue layer 106 is formed on a predetermined area of the surface 102 of the mold 100, such as the surface of the three-dimensional structure 104 of the mold 100, by, for example, a coating method, such as shown in shown in FIG. 2A and FIG. 2B, wherein FIG. 2A is the cross-sectional view and FIG. 2B is the corresponding top view. The glue layer 106 may have viscosity for the benefit of bonding semiconductor chips 116, 118 and 120 (referring to FIG. 5A). However, in other embodiments, the glue layer 106 may not be viscous while the glue layer 106 can temporarily fix the semiconductor chips 116, 118 and 120. A material of the glue layer 106 may be selected from the group consisting of polymer materials, silica materials, epoxy materials and acrylic materials.

Figure 3A:
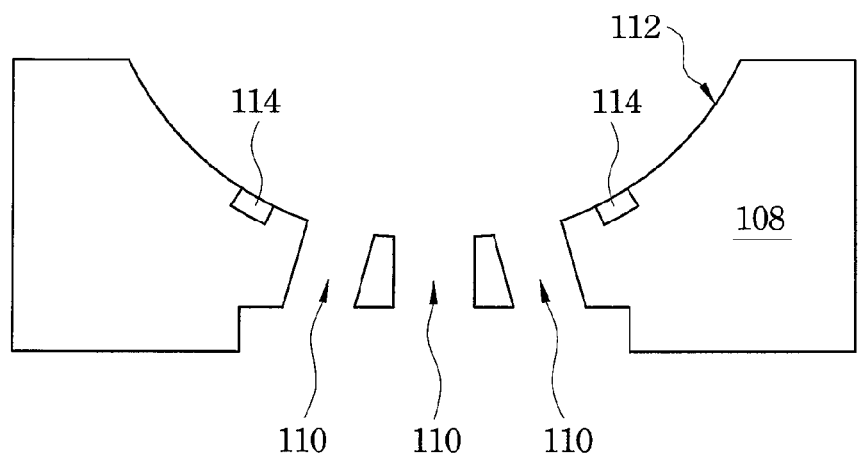
Figure 3B:
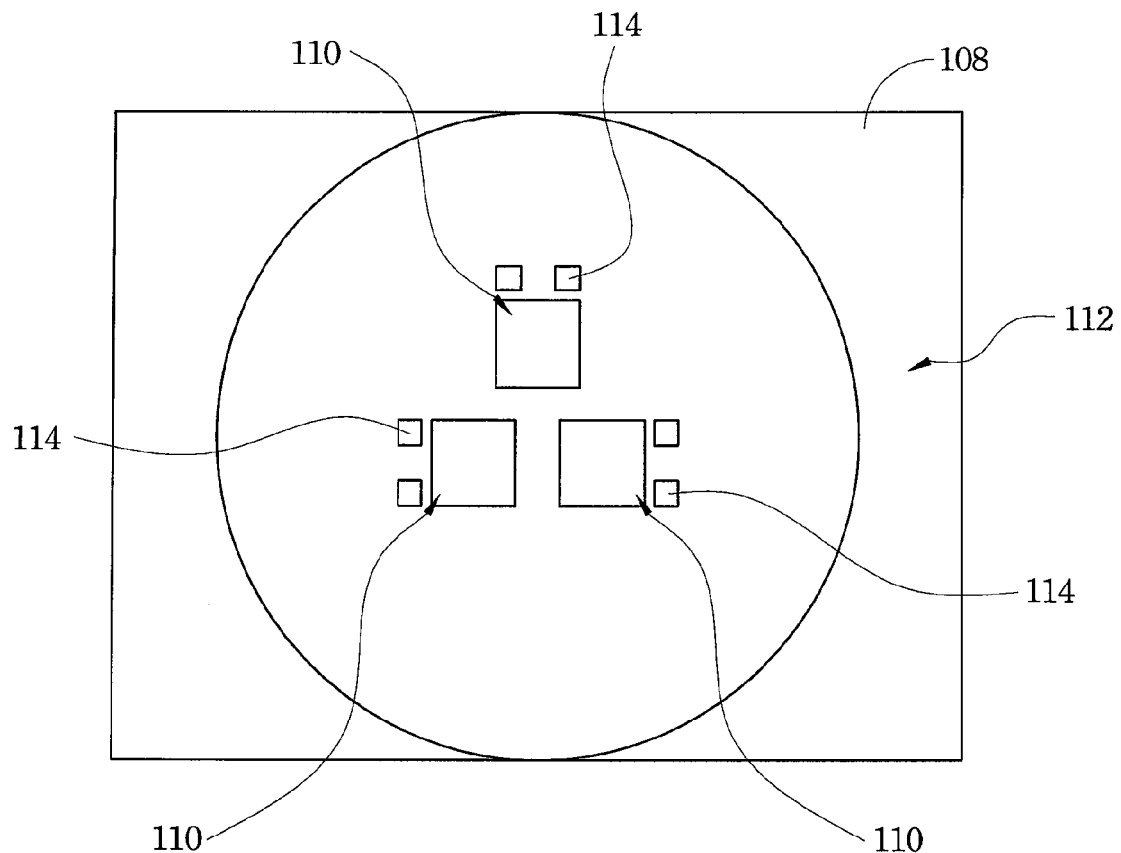

Then, simultaneously referring to FIG. 2A and FIG. 3A, a heat sink 108 with a structure corresponding to the structure of the mold 100 may be provided. The heat sink 108 is set with at least one opening 110, wherein the opening 100 passes through the heat sink 108. In the present exemplary embodiment, the heat sink 108 is set with three openings 110, such as shown in FIG. 3A. The heat sink 108 is preferably composed of a material of good thermal conductivity, and the heat sink 108 may be composed of a single metal layer structure, a metal compound layer structure consisting of at least one metal material, or a structure composed of a mixture mixed by metal materials and nonmetal materials. In one embodiment, the heat sink 108 may be a carrier including electric conduction circuits, such as a circuit board. In an exemplary embodiment, the heat sink 108 has a thickness greater than about 100 μm for larger heat conduction and larger thermal capacity. Corresponding to the structure of the mold 100, the heat sink 108 may be a three-dimensional structure, such as a structure with an uneven surface, such as shown in FIG. 3A; or, the heat sink 108 may be a two-dimensional structure, such as a flat plate with flat surfaces. In an embodiment, a surface 112 of the heat sink 108 is selectively set with at least two electric contacts 114 to respectively and electrically connect to a P-type electrode and an N-type electrode of each of the semiconductor chips 116, 118 and 120 (referring to FIG. 5A) subsequently disposed in the openings 110 of the heat sink 108. In other embodiments, the surface 112 of the heat sink 108 may not be set with any electrical contacts, and the heat sink 108 can be electrically connected to an external circuit directly with wires. In the present exemplary embodiment, such as shown in FIG. 3B, three openings 110 are set in the heat sink 108 to provide three semiconductor chips 116, 118 and 120 respectively disposed therein, and the heat sink 108 is set with six electric contacts 114, wherein each of the semiconductor chips 116, 118 and 120 corresponds to two of the electric contacts 114.

Figure 4A:
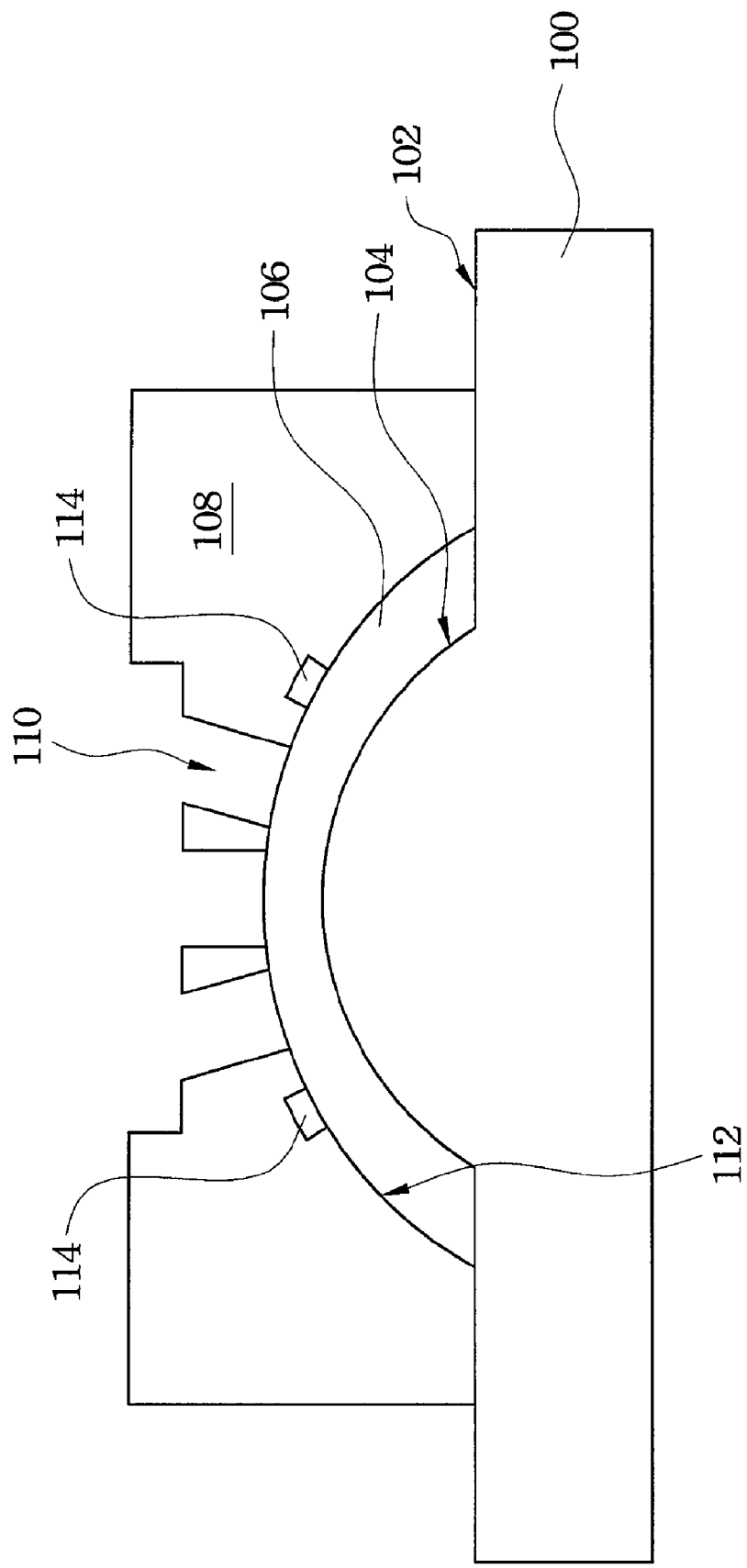
Figure 4B:
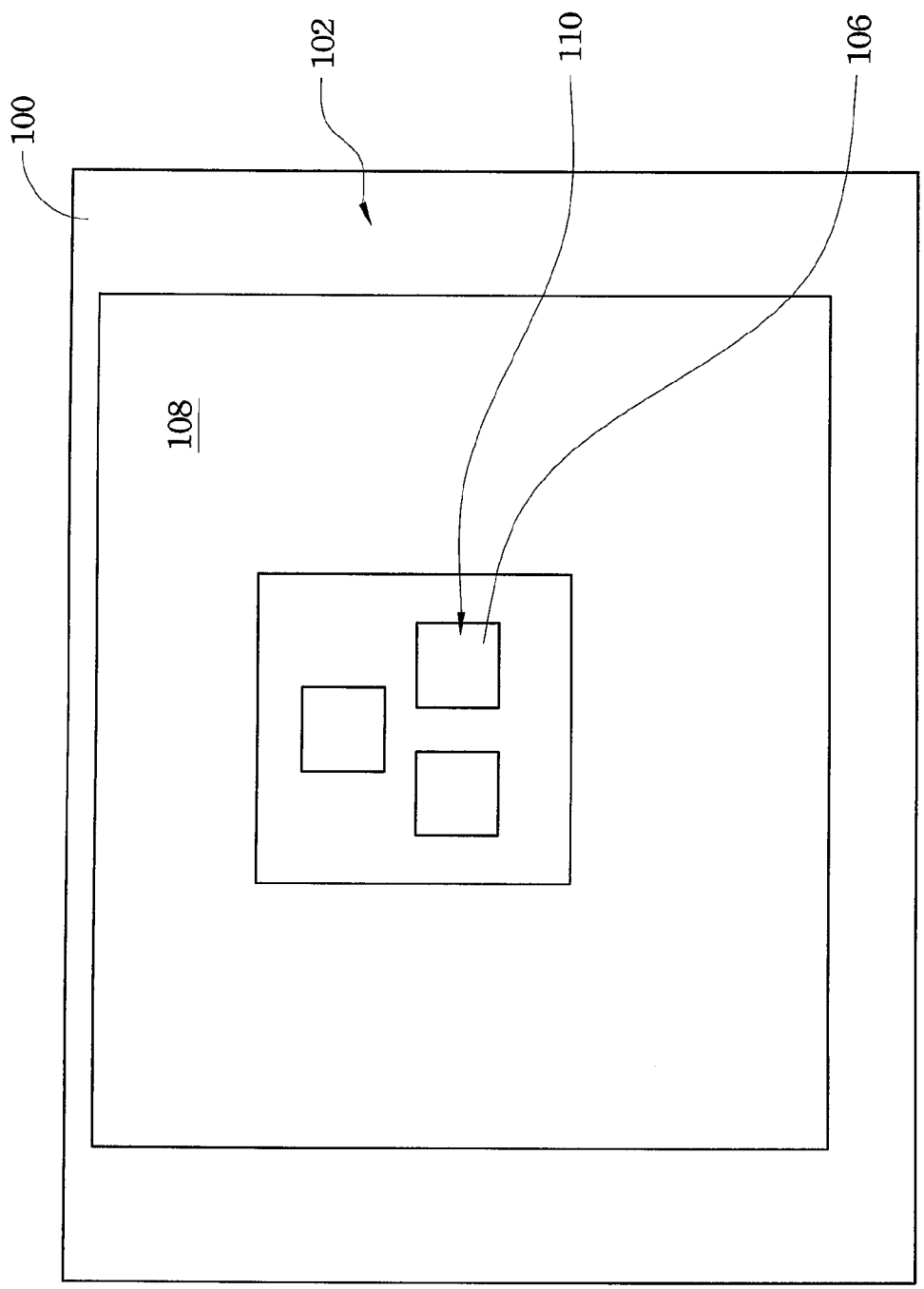

Subsequently, the heat sink 108 is disposed on the surface 102 of the mold 100 to make the heat sink 108 adhere to the surface 102 of the mold 100 through the glue layer 106, wherein the surface 112 of the heat sink 108 is opposite to the surface 102 of the mold 100, and the openings 110 of the heat sink 108 correspond to the predetermined area of the surface 102 of the mold 100 covered by the glue layer 106, for example, the surface of the three-dimensional structure 104 of the mold 100, such as shown in FIG. 4A. The openings 110 of the heat sink 108 pass through the heat sink 108, so that when the heat sink 108 is disposed on the surface 102 of the mold 100, a portion of the glue layer 106 on the predetermined area of the surface 102 of the mold 100 is exposed by the openings 110 of the heat sink 108, such as shown in FIG. 4A and FIG. 4B.

Next, at least one semiconductor chip, such as the semiconductor chips 116, 118 and 120, are provided, wherein the semiconductor chips 116, 118 and 120 respectively correspond to the openings 110 of the heat sink 108. In the present exemplary embodiment, a material of the semiconductor chips 116, 118 and 120 is, for example, selected from the group consisting of Si-based materials, GaN-based materials, AlN-based materials, AlGaInP-based materials, PbS-based materials, SiC-based materials and GaAs-based materials. In some embodiments, each of the semiconductor chips 116, 118 and 120 may be an electronic device, such as a BJT, a MOS, a CMOS or a hetero-junction transistor. In another embodiment, each of the semiconductor chips 116, 118 and 120 is, for example, an integrated circuit chip. In still another embodiment, each of the semiconductor chips 116, 118 and 120 is, for example, a photoelectric chip, such as a light-emitting diode (LED), a laser diode (LD) or a solar cell. In one embodiment, each of the semiconductor chips 116, 118 and 120 includes two electrodes of opposite conductivity types, and the electrodes may be disposed on the same side or opposite sides of each of the semiconductor chips 116, 118 and 120. In each of the semiconductor chips 116, 118 and 120, while one of the electrodes is N-type, the other electrode is P-type; and while one of the electrodes is P-type, the other electrode is N-type. In the present invention, the semiconductor chips 116, 118 and 120 may be unpackaged semiconductor chips, partially packaged semiconductor chips, or completely packaged semiconductor chips.

Figure 5A:
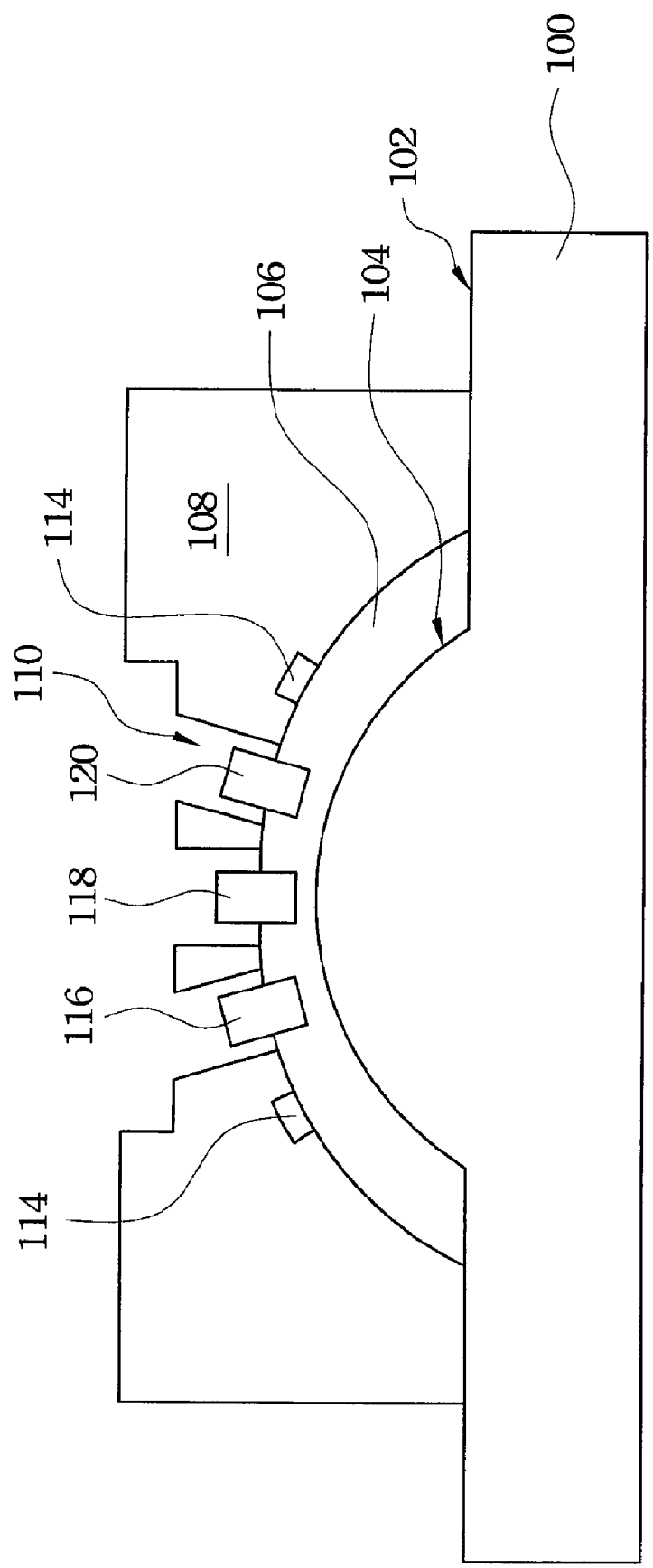
Figure 5B:
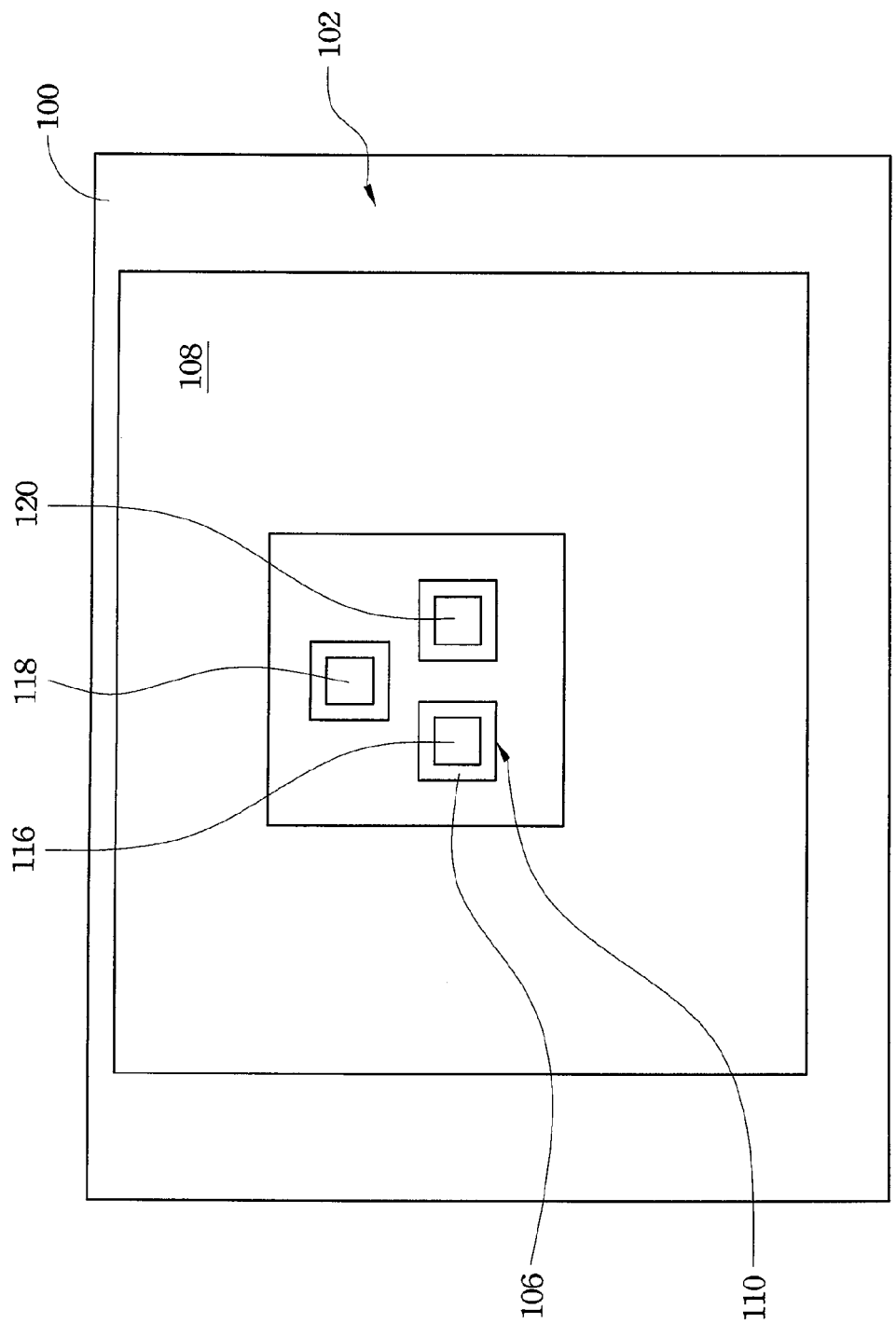

The semiconductor chips 116, 118 and 120 are correspondingly disposed in the openings 110 of the heat sink 108, wherein one side of each of the semiconductor chips 116, 118 and 120 is pressed into the exposed glue layer 106 exposed by the openings 110 of the heat sink 108, and the opposite side of each of the semiconductor chips 116, 118 and 120 faces upward and is exposed, such as shown in shown in FIG. 5A and FIG. 5B, wherein FIG. 5A is the cross-sectional view and FIG. 5B is the corresponding top view. With the glue layer 106, the semiconductor chips 116, 118 and 120 can be temporarily fixed in the openings 110 of the heat sink 108. When one semiconductor device includes a plurality of semiconductor chips, such as semiconductor chips 116, 118 and 120, these semiconductor chips can be arbitrarily arranged according to the need of the product, and the locations of the openings 110 of the heat sink 108 are designed according to a predetermined arrangement of the semiconductor chips.

Figure 6A:
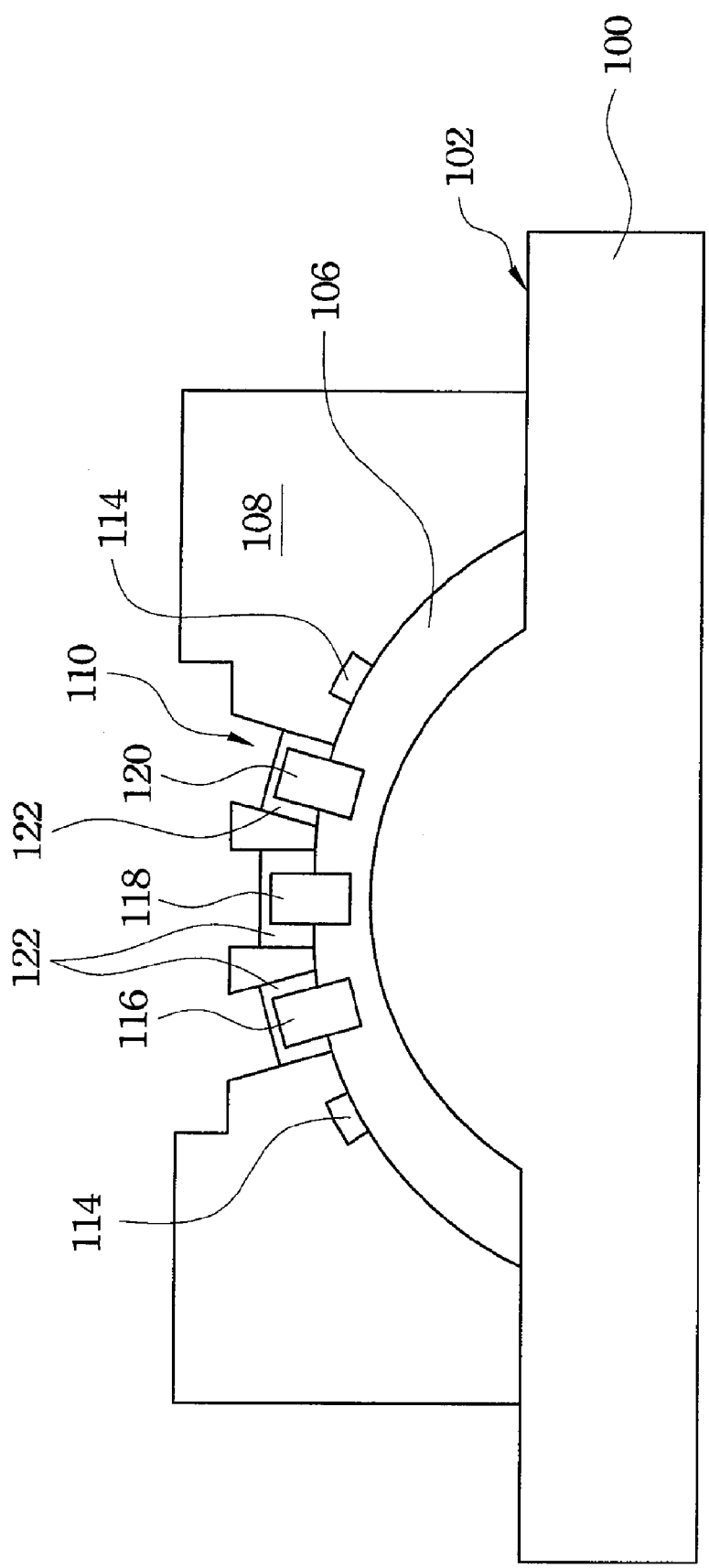
Figure 6B:
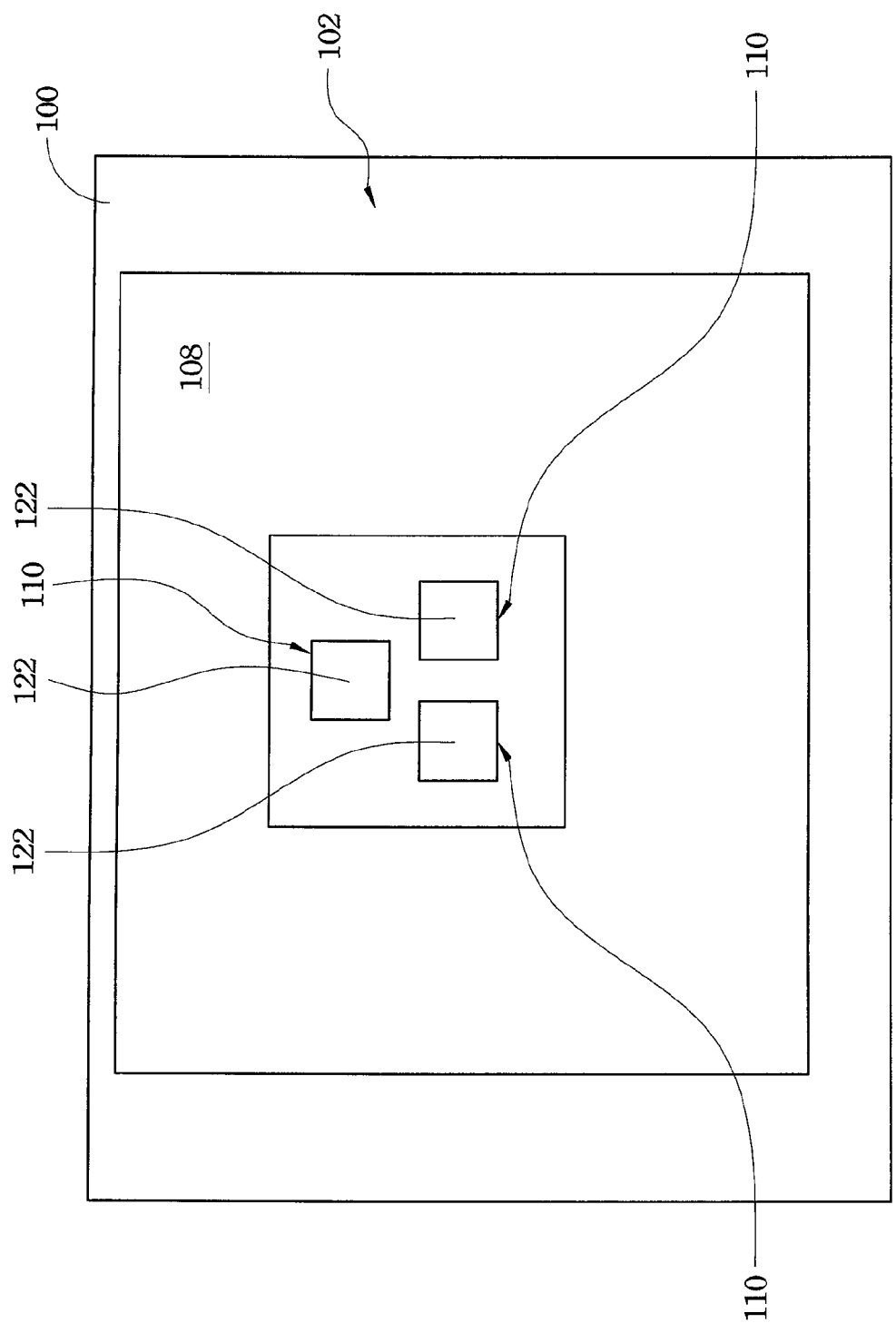

Next, an electricity conducting thin film 122 is formed to fill the openings 110 of the heat sink 108 and to cover the side of each semiconductor chip 116, 118 and 120 uncovered by the glue layer 106 by, for example, an evaporation method, a sputtering method, an electroless plating method or an electro plating method, wherein the electricity conducting thin film 122 only fills in a portion of the depth of the openings 110 of the heat sink 108, such as shown in shown in FIG. 6A and FIG. 6B, wherein FIG. 6A is the cross-sectional view and FIG. 6B is the corresponding top view. As a result, the side of each of the semiconductor chips 116, 118 and 120 uncovered by the glue layer 106 is embedded in the electricity conducting thin film 122. In an exemplary embodiment, a thickness of the electricity conducting thin film 122 is preferably less than about 10 μm. The material of the electricity conducting thin film 122 may be a metal, an inorganic material with electric conductivity, a metal oxide or a metal nitride. In one embodiment, a material of the electricity conducting thin film 122 is, for example, a nano-scale material or a material including nano-scale composition. In some embodiments, the electricity conducting thin film 122 may be composed of a multi-layer thin film structure of electric conductivity, wherein the multi-layer thin film structure of the electricity conducting thin film 122 is, for example, a ceramic material layer/metal layer structure, a diamond thin film/metal layer structure, a metal oxide layer/metal layer structure, or a metal nitride layer/metal layer structure.

Figure 7A:
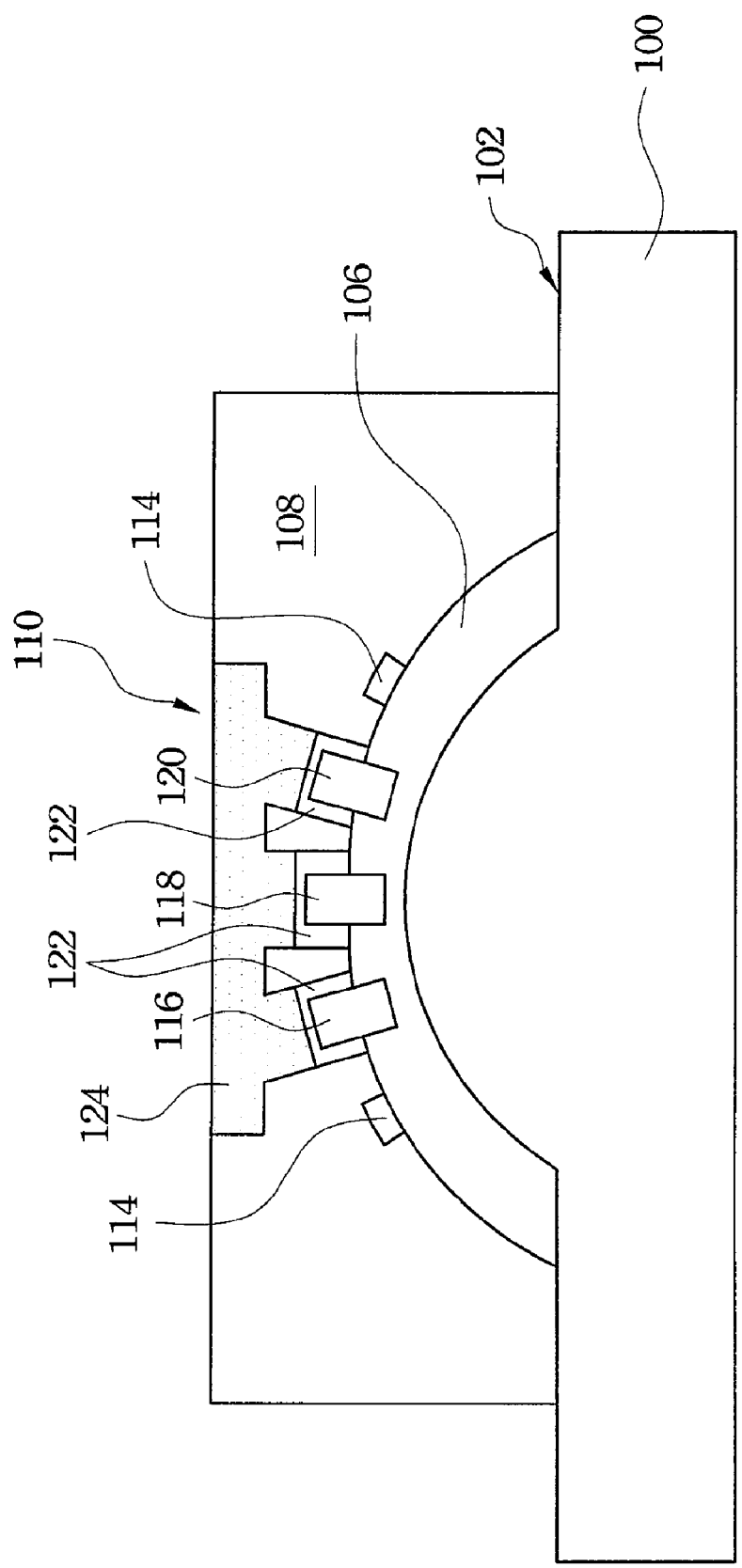
Figure 7B:
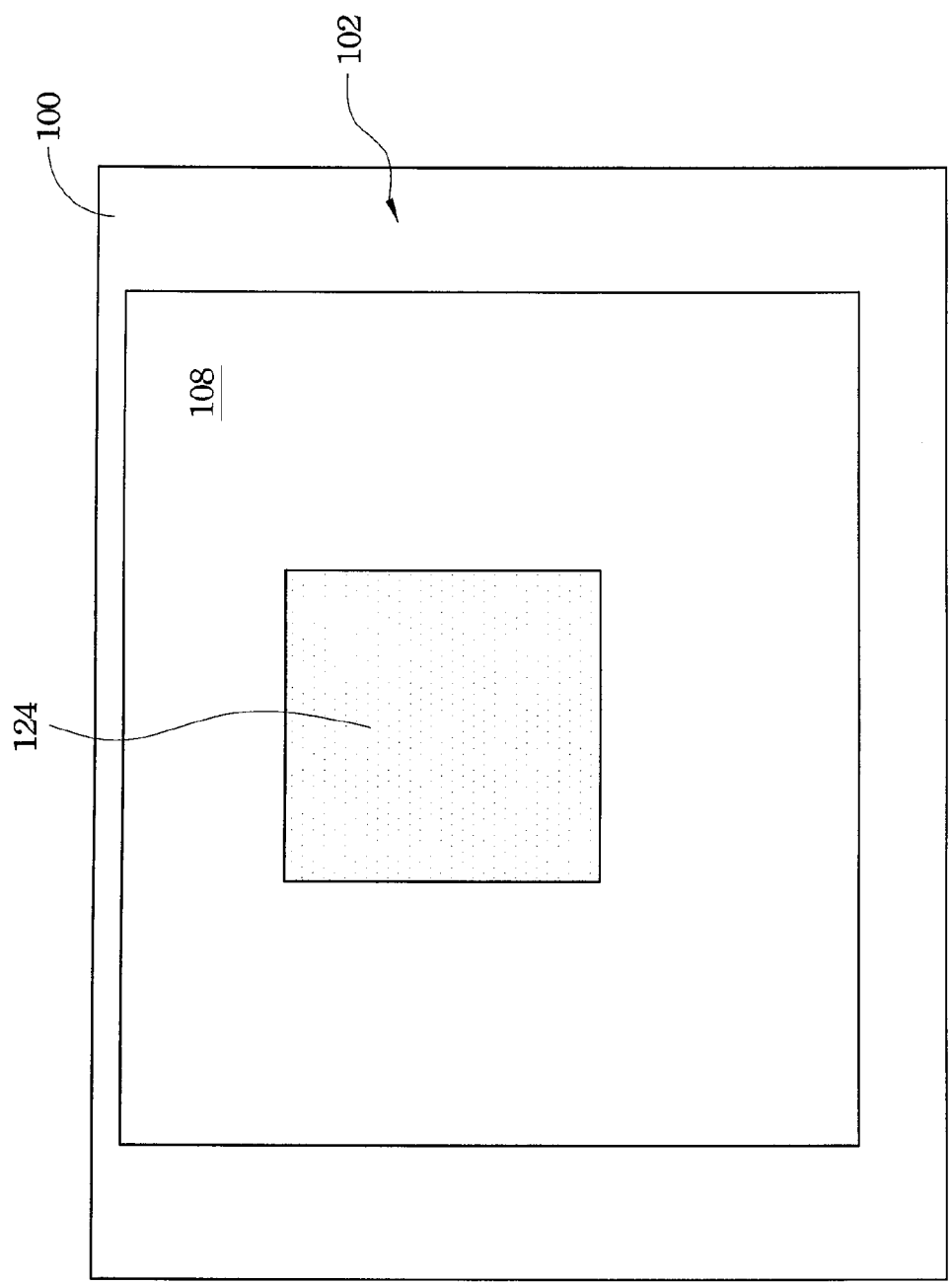

Then, a heat conducting thick film 124 is formed to fill the other portion of the depth of the openings 110 of the heat sink 108 and to directly cover the electricity conducting thin film 122 by, for example, an electroless plating method or an electro plating method. The heat conducting thick film 124 preferably fills and levels up the openings 110 of the heat sink 108, such as shown in shown in FIG. 7A and FIG. 7B, wherein FIG. 7A is the cross-sectional view and FIG. 7B is the corresponding top view. In one exemplary embodiment, the heat conducting thick film 124 preferably has a thickness greater than about 100 μm for larger heat conduction and larger thermal capacity. A material of the heat conducting thick film 124 is, for example, a metal, an inorganic material with high heat conductivity, a metal oxide or a metal nitride. In one embodiment, a material of the heat conducting thick film 124 may be carbon. In another embodiment, a material of the heat conducting thick film 124 may be aluminum nitride (AlN). In still another embodiment, a material of the heat conducting thick film 124 may be a nano material with high heat conductivity, such as a carbon nanotube. In other embodiments, a material of the heat conducting thick film 124 may include a mixture composed of at least two of nano materials, metals, nonmetals and inorganic materials. In other embodiments, a material of the heat conducting thick film 124 may include a mixture composed of at least two of metal oxides, metal nitrides, metals, nonmetals and inorganic materials.

Figure 8A:
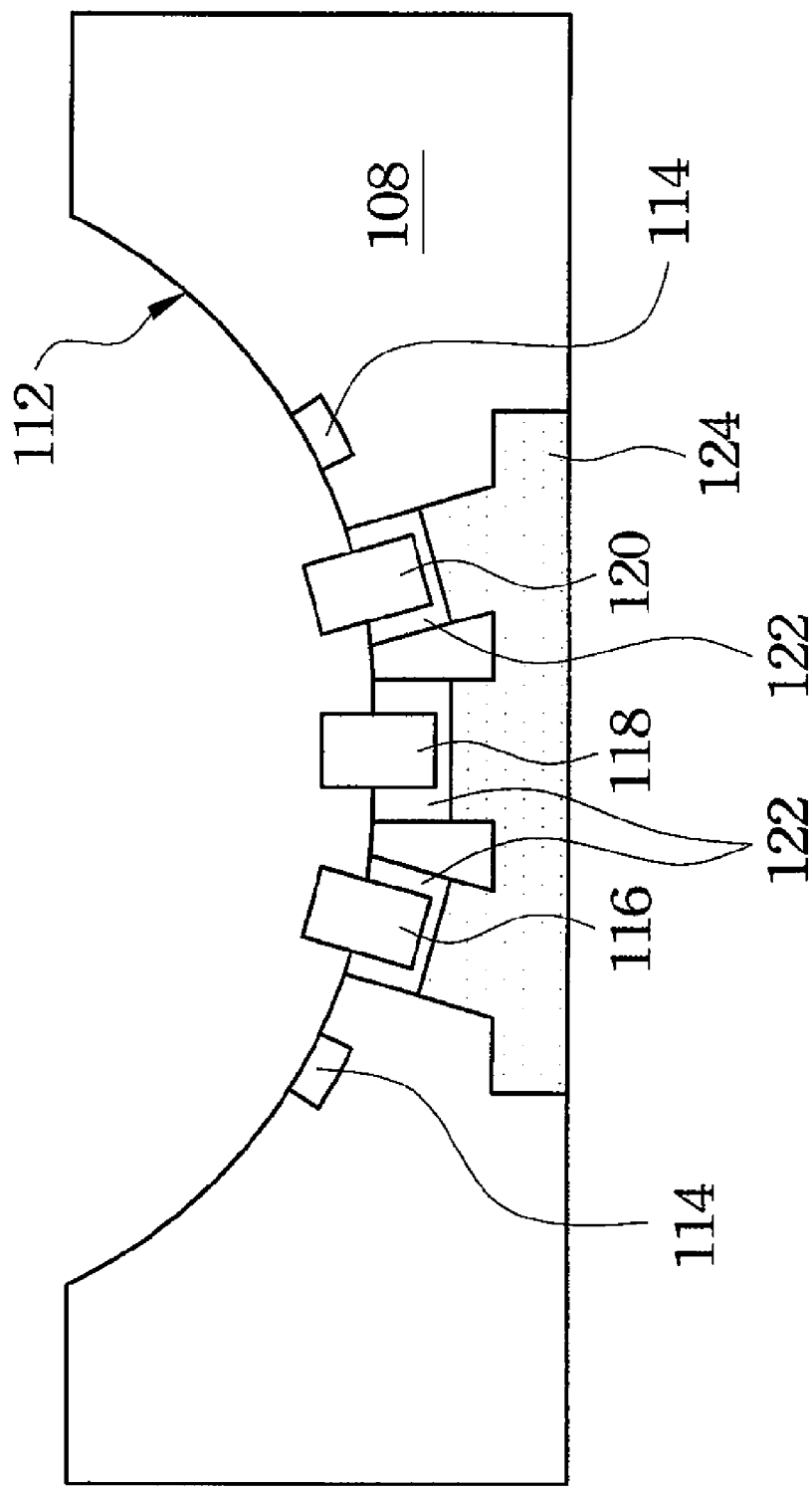
Figure 8B:
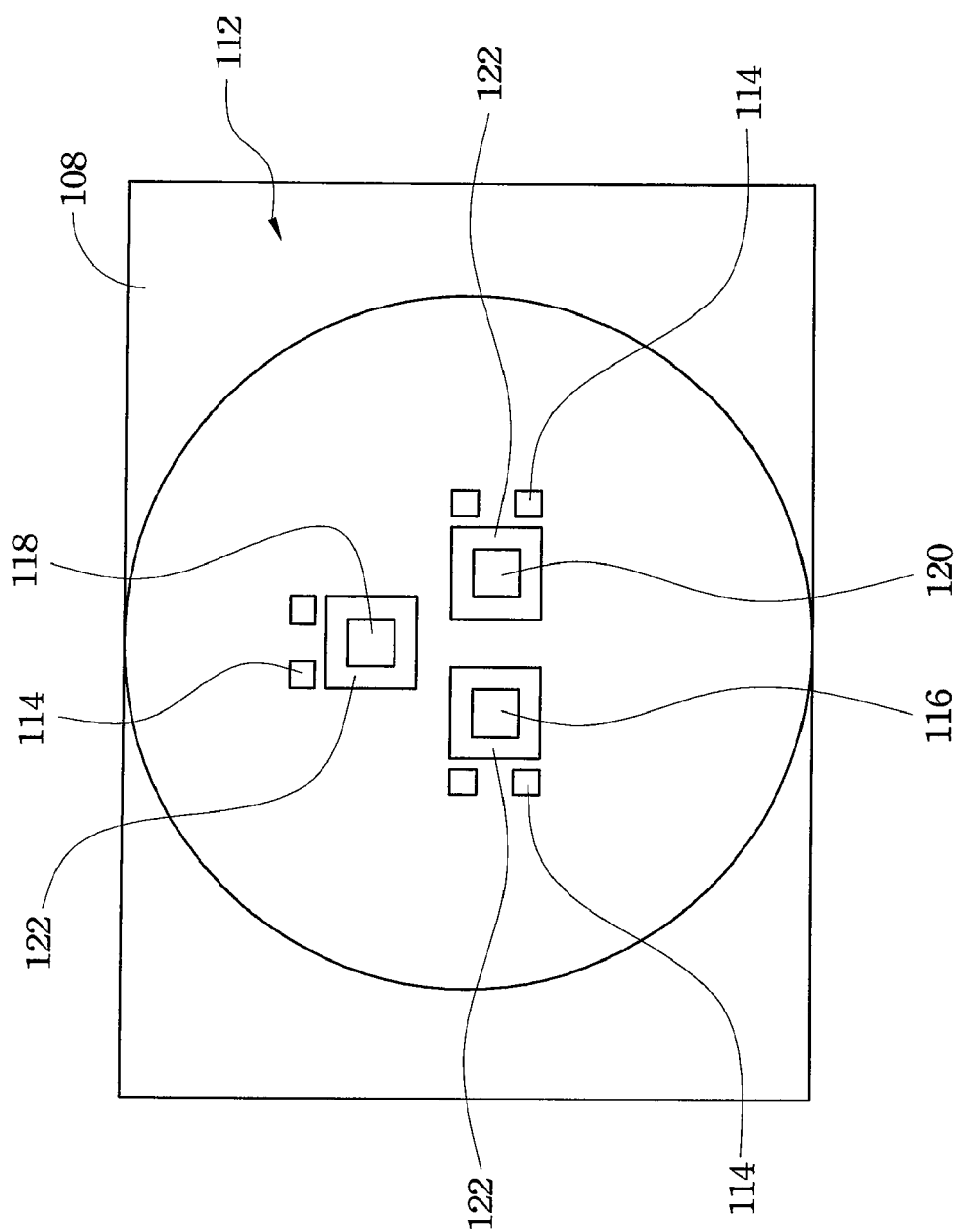

Next, the glue layer 106 and the mold 100 are removed to expose the side of each of the semiconductor chips 116, 118 and 120 previously covered by the glue layer 106, the portion of the electricity conducting thin film 122 connected with the glue layer 106, and the surface 112 of the heat sink 108 connected with the glue layer 112. The electric contacts 114 set in the surface 112 of the heat sink 108 are simultaneously exposed when the glue layer 106 is removed, such as shown in shown in FIG. 8A and FIG. 8B, wherein FIG. 8A is the cross-sectional view and FIG. 8B is the corresponding top view.

Figure 9B:
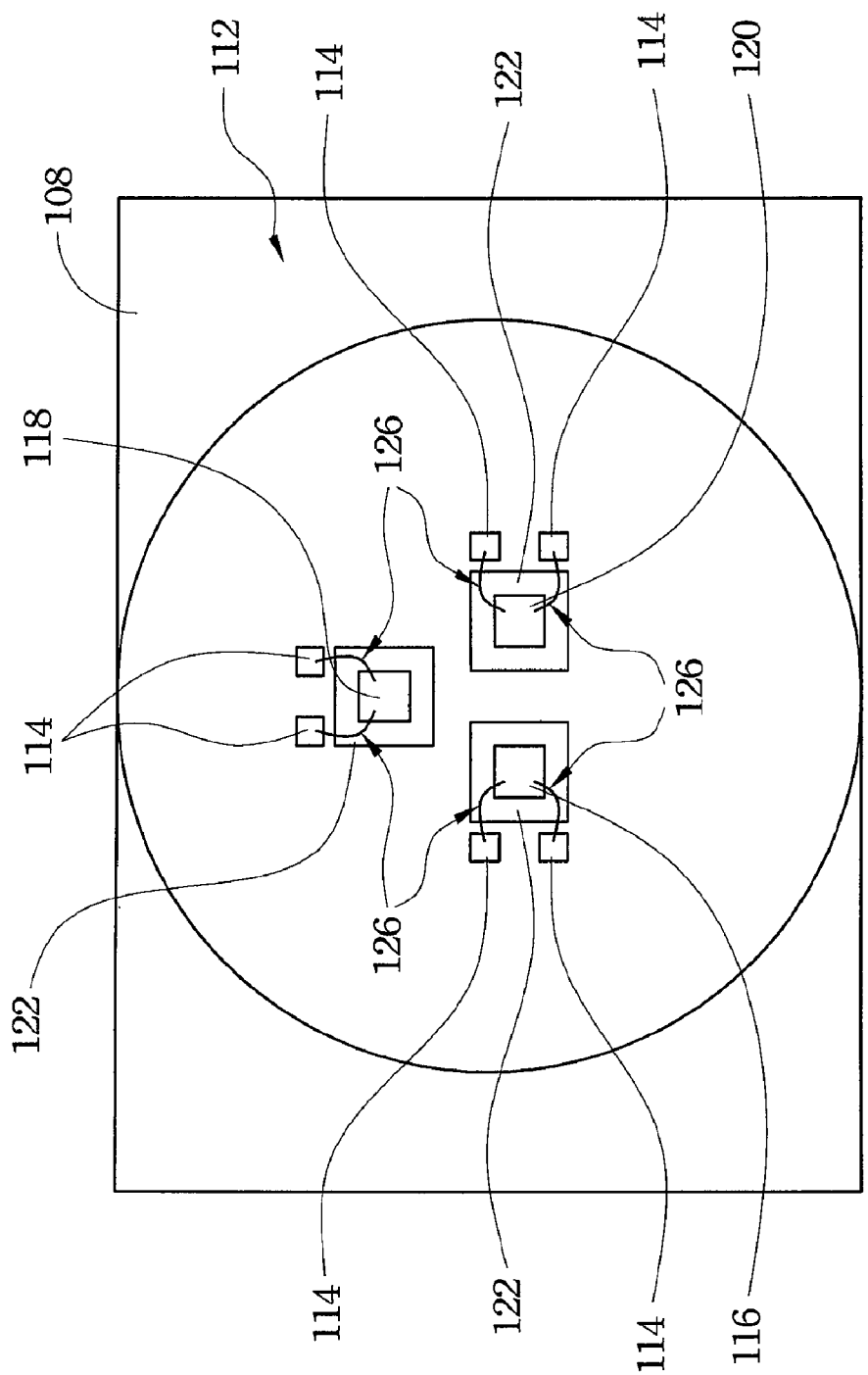

In the present exemplary embodiment, the electrodes of different conductivity type of each semiconductor chip 116, 118 and 120 are set on the same side of each semiconductor chip 116, 118 and 120. Accordingly, the heat sink 108 is set with six electric contacts 114, i.e. three pairs of electric contacts 114, and each of the semiconductor chips 116, 118 and 120 corresponds to one pair of the electric contacts 114, and two electrodes of each semiconductor chips 116, 118 and 120 correspond to one pair of the electric contacts 114, such as the top view shown in FIG. 8B. Therefore, six wires 126 are formed by, for example, a wire bonding method to electrically connect the electrodes of the semiconductor chips 116, 118 and 120 to the corresponding electric contacts 114, such as shown in shown in FIG. 9A and FIG. 9B, wherein FIG. 9A is the cross-sectional view and FIG. 9B is the corresponding top view. Subsequently, the electrodes of the semiconductor chips 116, 118 and 120 are electrically connected to an external circuit through the circuit presser in the heat sink 108. In some embodiment, wires can be directly used to electrically connect the electrodes of the semiconductor chips 116, 118 and 120 to an external circuit, and it is unnecessary to set relay electric contacts in the heat sink 108 to connect the electrodes of the semiconductor chips 116, 118 and 120 and the external circuit. In one embodiment, the external circuit electrically connected to the semiconductor chips 116, 118 and 120 is, for example, an additionally provided printed circuit board, wherein one end of each wire formed subsequently to electrically connect the semiconductor chip 116, 118 or 120 and the printed circuit board is connected to the semiconductor chip 116, 118 or 120, and the other end of each wire is connected to the printed circuit board, so as to form the electrical connection between the semiconductor chip 116, 118 or 120 and the printed circuit board. In the present invention, the electric connection between the semiconductor chip 116, 118 or 120 and an external circuit, such as a printed circuit board, can be formed by, for example, a wire bonding method, a flip-chip bonding method or a tape bonding method.

In another embodiment, two electrodes of each semiconductor chip 116, 118 and 120 are respectively disposed on opposite sides of each semiconductor chip 116, 118 and 120, wherein the heat sink 108 can only be set with three electric contacts 114, and the electrode, such as a P-type electrode or the N-type electrode, of each semiconductor chip 116, 118 and 120 exposed on the surface 112 of the heat sink 108 can be electrically connected to one corresponding electric contact 114 through one wire 126. Of course, the electrode of each semiconductor chip 116, 118 and 120 exposed on the surface 112 of the heat sink 108 also can be electrically connected to an external circuit directly by using a wire and without using the electric contact 114 of the heat sink 108. In one embodiment, only one semiconductor chip is set in the heat sink, and two electrodes of the semiconductor chip are respectively disposed on opposite sides of the semiconductor chip, so that only one wire is needed to electrically connect the electrode of the semiconductor chip exposed on the surface 112 of the heat sink 108 and an external circuit; or, an electric contact 114 is formed in surface 112 of the heat sink 108, and then a wire is formed to electrically connect the exposed electrode of the semiconductor chip and the electric contact 114 of the heat sink 108.

Figure 10A:
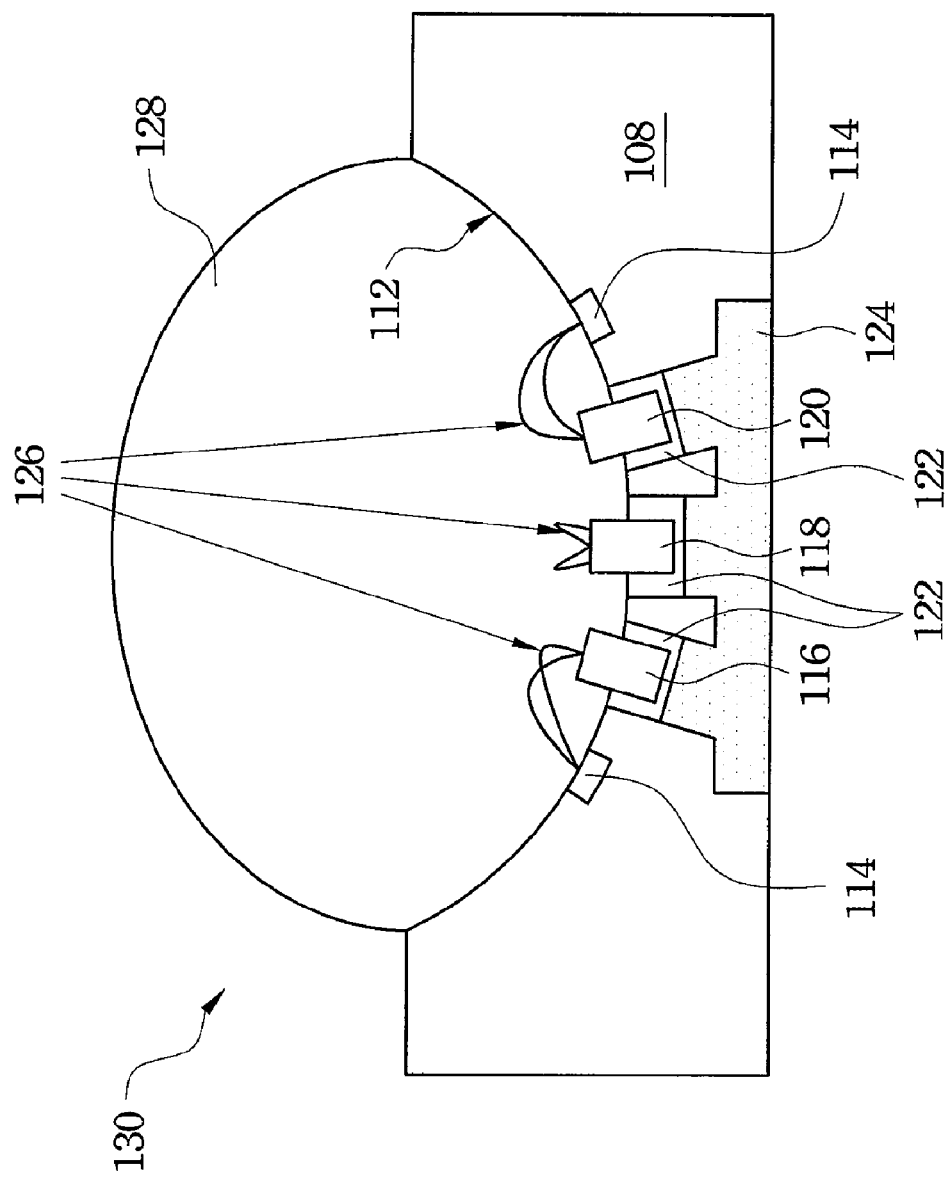
Figure 10B:
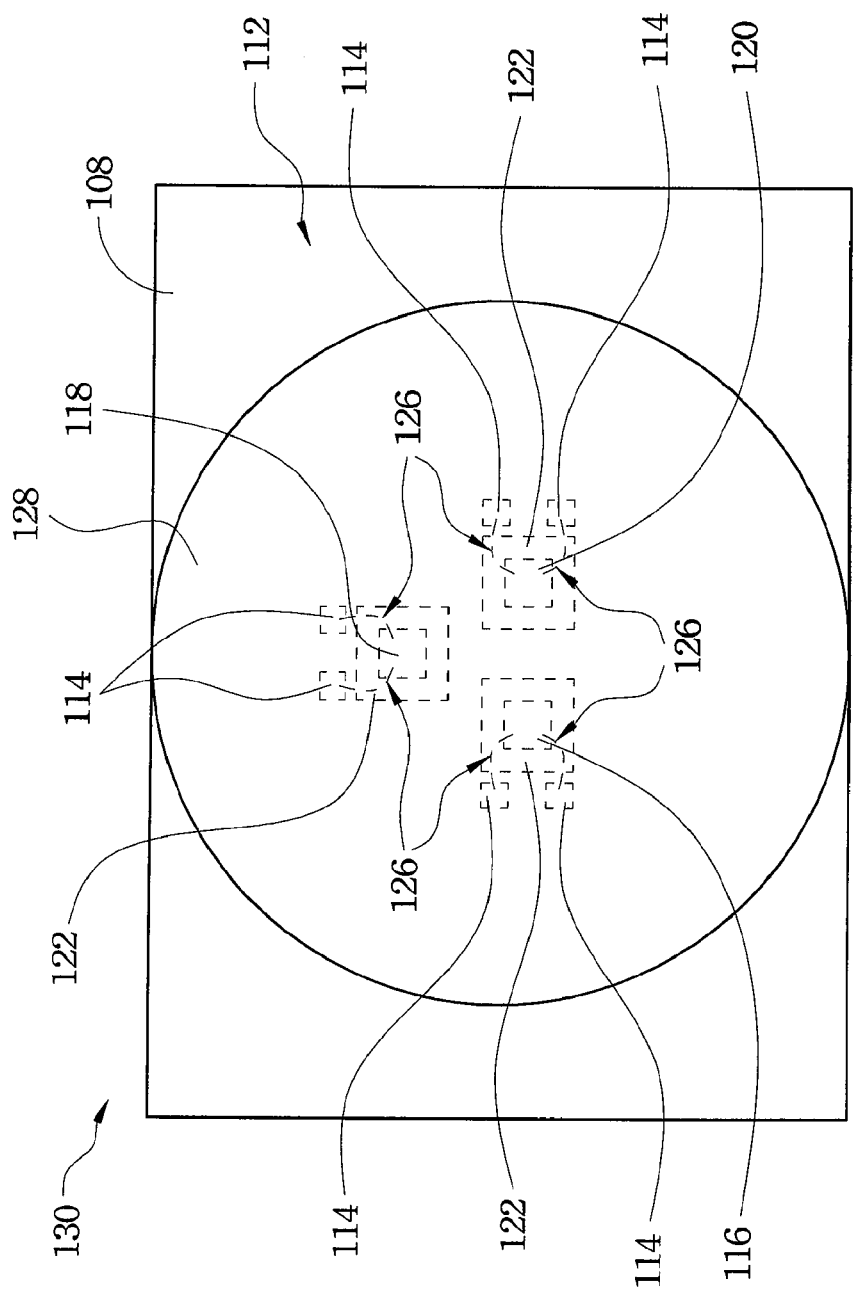

Then, an encapsulant 128 is formed to cover the surface 112 of the heat sink 108 and to completely encapsulate the semiconductor chips 116, 118 and 120 and the exposed portion of the electricity conducting thin film 122. In the present exemplary embodiment, the encapsulant 128 further completely encapsulate the wires 126 and the electric contacts 114, such as shown in shown in FIG. 10A and FIG. 10B, wherein FIG. 10A is the cross-sectional view and FIG. 10B is the corresponding top view. In another embodiment, the semiconductor chips 116, 118 and 120 are electrically connected to an external circuit, such as a printed circuit board, directly through several wires, and the encapsulant 128 encapsulates the wires and a portion of the printed circuit board, especially the connections between the wires and the printed circuit board to ensure the connection stability between the wires and the printed circuit board.

In the present exemplary embodiment, a heat sink preset with at least one opening is directly provided, and the heat sink and the semiconductor chip are then fixed to a mold or a temporary substrate having a structure matching the heat sink by glue, so that the semiconductor chip and the heat sink can be combined only by filling the opening of the heat sink with an electricity conducting thin film and a heat conducting thick film, and the semiconductor chip can be directly embedded in the heat sink through the electricity conducting thin film. Therefore, it is unnecessary to use an electro plating method to form the whole heat sink, so that the fabrication time of a semiconductor device can be greatly reduced to achieve the benefit of time, and the material cost needed by a large amount of plating can be saved to effectively reduce the fabrication cost. In comparison with the convention technique that forms the whole heat sink by an electro plating method, one exemplary embodiment of the present invention is about eight times the fabrication speed of the convention technique, and is about one-sixth time the fabrication cost of the convention technique.

According to the aforementioned description, in the semiconductor device of an exemplary embodiment of the present invention, semiconductor chips can be closely connected with the heat sink directly through an electricity conducting thin film with high electrical conductivity and a heat conducting thick film with high heat conductivity without using glue. The heat conductivities of the highly conductive electricity conducting thin film and the highly conductive heat conducting thick film are much higher than that of the conventional glue material, so that the thermal resistance at the junction between the semiconductor chips and the heat sink in the package process can be greatly reduced. As a result, the heat-dissipating ability of semiconductor device can be greatly enhanced, a high temperature process for fixing the semiconductor chip is eliminated to prevent the optical and electrical properties of the semiconductor device from being damaged, and the efficiency and the stability of the semiconductor device can be increased.

According to the aforementioned description, the semiconductor device of an exemplary embodiment of the present invention has superior heat-dissipating ability, so that the semiconductor device can be operated with high power to effectively bring out its original functions. In addition, a large amount of heat generated by the semiconductor device with superior heat-dissipating ability operated at a high operation speed can be rapidly conducted and dissipated, so that it can prevent the semiconductor device from be burned out by the high temperature, thereby greatly prolonging the operation life of the device.

According to the aforementioned description, the semiconductor device of an exemplary embodiment of the present invention has a high heat-conducting ability, so that a heat-dissipating device, such as a fan or a heat pipe, is unnecessary. As a result, the volume of the semiconductor device can be reduced, the device complexity of the semiconductor device can be lowered, and the cost of the device can be greatly decreased.

According to the aforementioned description, the method for manufacturing a semiconductor device of an exemplary embodiment of the present invention can effectively decrease the process time to achieve a benefit of mass production.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a semiconductor device, comprising:
   providing a mold;
   forming a glue layer on a predetermined area of a surface of the mold;
   disposing a heat sink on the surface of the glue layer, and the opening corresponds to the predetermined area of the surface of the mold and exposes a portion of the glue layer;
   providing at least one semiconductor ship correspondingly disposed in the opening of the heat sink, wherein the semiconductor chip includes a first side and a second side on opposite sides, and the first side of the semiconductor chip is pressed in the glue layer exposed by the opening;

forming an electricity conducting thin film to fill in a first depth portion of the opening and to cover the second side of the semiconductor chip;

forming a heat conducting thick film to fill in a second depth portion of the opening and to directly cover the electricity conducting thin film;

removing the glue layer and the mold to expose the first side of the semiconductor chip, a portion of the electricity conducting thin film and the heat sink;

forming at least one wire to electrically connect the semiconductor chip and an external circuit; and forming an encapsulant to encapsulate a portion of the heat sink, the semiconductor chip, the wire and an exposed portion of the electricity conducting thin film.

2. The method for manufacturing a semiconductor device according to claim 1, wherein each of the mold and the heat sink is a three-dimensional structure.

3. The method for manufacturing a semiconductor device according to claim 1, wherein the glue layer has viscosity.

4. The method for manufacturing a semiconductor device according to claim 1, wherein a material of the glue layer is selected from the group consisting of polymer materials, silica materials, epoxy materials and acrylic materials.

5. The method for manufacturing a semiconductor device according to claim 1, wherein a thickness of the heat sink is greater than about 100 μm.

6. The method for manufacturing a semiconductor device according to claim 1, wherein the semiconductor chip is selected from the group consisting of a BJT, a MOS, a CMOS, a hetero-junction transistor, a light-emitting diode, a laser diode, a solar cell and an integrated circuit chip.

7. The method for manufacturing a semiconductor device according to claim 1, wherein the semiconductor chip is an unpackaged semiconductor chip, a partially packaged semiconductor chip or a completely packaged semiconductor chip.

8. The method for manufacturing a semiconductor device according to claim 1, wherein a thickness of the electricity conducting thin film is less than about 10 μm.

9. The method for manufacturing a semiconductor device according to claim 1, wherein a material of the electricity conducting thin film is a metal, an inorganic material with electric conductivity, a metal oxide or a metal nitride.

10. The method for manufacturing a semiconductor device according to claim 1, wherein a material of the electricity conducting thin film is a nano-scale material or a material including nano-scale composition.

11. The method for manufacturing a semiconductor device according to claim 1, wherein the electricity conducting thin film is composed of a multi-layer thin film structure of electric conductivity, wherein the multi-layer thin film structure is a ceramic material layer/metal layer structure, a diamond thin film/metal layer structure, a metal oxide layer/metal layer structure, or a metal nitride layer/metal layer structure.

12. The method for manufacturing a semiconductor device according to claim 1, wherein the step of forming the electricity conducting thin film is performed by an evaporation method, a sputtering method, an electroless plating method or an electro plating method.

13. The method for manufacturing a semiconductor device according to claim 1, wherein a material of the heat conducting thick film is a metal, an inorganic material with high heat conductivity, a nano material with high heat conductivity, a metal oxide or a metal nitride.

14. The method for manufacturing a semiconductor device according to claim 1, wherein a material of the heat conducting thick film is carbon or a carbon nanotube.

15. The method for manufacturing a semiconductor device according to claim 1, wherein a material of the heat conducting thick film is a mixture composed of at least two of metal oxides, metal nitrides, metals, nonmetals and inorganic materials.

16. The method for manufacturing a semiconductor device according to claim 1, wherein the step of forming the heat conducting thick film is performed by an electroless plating method or an electro plating method.

* * * * *